(12) United States Patent
Omura et al.

(10) Patent No.: US 6,311,300 B1
(45) Date of Patent: Oct. 30, 2001

(54) SEMICONDUCTOR TESTING APPARATUS FOR TESTING SEMICONDUCTOR DEVICE INCLUDING BUILT IN SELF TEST CIRCUIT

(75) Inventors: Ryuji Omura; Kazushi Sugiura; Mari Shibayama, all of Hyogo (JP)

(73) Assignees: Mitsubishi Denki Kabushiki Kaisha, Tokyo; Ryoden Semiconductor System Engineering Corporation, Hyogo, both of (JP)

( * ) Notice: Subject to any disclaimer, the term of this patent is extended or adjusted under 35 U.S.C. 154(b) by 0 days.

(21) Appl. No.: 09/196,438

(22) Filed: Nov. 20, 1998

(30) Foreign Application Priority Data

Jun. 16, 1998 (JP) .................................................. 10-168450

(51) Int. Cl.$^7$ .................................................. H04B 17/00
(52) U.S. Cl. .......................................... 714/724; 714/733
(58) Field of Search ..................................... 714/724, 733

(56) References Cited

U.S. PATENT DOCUMENTS

| | | | |
|---|---|---|---|
| 5,006,787 | 4/1991 | Katircioglu et al. | 324/73.1 |
| 5,497,079 | * 3/1996 | Yamada et al. | 324/158.1 |
| 5,619,512 | * 4/1997 | Kawashima et al. | 714/733 |
| 5,666,049 | * 9/1997 | Yamada et al. | 324/158.1 |

FOREIGN PATENT DOCUMENTS

| | | |
|---|---|---|
| 198 23 583 A1 | 12/1998 | (DE) . |
| 0 805 459 A1 | 11/1997 | (EP) . |
| 2 327 506 | 1/1999 | (GB) . |
| WO 98/07163 | 2/1998 | (WO) . |
| WO 98/11555 | 3/1998 | (WO) . |

* cited by examiner

*Primary Examiner*—Phung M. Chung
(74) *Attorney, Agent, or Firm*—McDermott, Will & Emery

(57) ABSTRACT

A program power supply of a tester applies a power supply voltage to an IC to be tested. A pattern generator applies a clock signal and a command signal to a BIST circuit of IC. BIST circuit tests memory IC unit and logic IC unit and serially outputs data indicative of test result to a converter of tester. Converter converts the applied serial data to parallel data and applies to computer. As compared with the prior art in which address signal and control signal are applied to IC to be tested, the number of pins necessary for the test can be reduced. Therefore, cost of the test is reduced and efficiency of the test is improved.

7 Claims, 8 Drawing Sheets

SEMICONDUCTOR TESTING APPARATUS FOR TESTING SEMICONDUCTOR DEVICE INCLUDING BUILT IN SELF TEST CIRCUIT

BACKGROUND OF THE INVENTION

1. Field of the Invention

The present invention relates to a semiconductor testing apparatus, and more particularly, for a semiconductor testing apparatus for testing a semiconductor device including a built in self test circuit.

2. Description of the Background Art

In a conventional IC test, a number of test channels are provided and each channel, test signals each having a prescribed test waveform in accordance with the condition of testing, that is, a test signal having a prescribed voltage level and a prescribed timing of waveform change is formed, and the test signals are applied to respective corresponding pins of an IC to be tested, whereby electrical characteristic of the IC has been tested.

FIG. 8 is a block diagram showing the structure of a conventional IC tester 50. Referring to FIG. 8, a test flow or a test condition is programmed in accordance with test specification, in an IC tester control CPU 51 of IC tester 50. IC tester control CPU 51 applies a control signal to various circuits of IC tester 50 and sets data of various circuits, through control signal transfer bus 52 as needed. A reference signal generating circuit 53 generates an operational reference signal of IC tester 50. The reference signal serves as a reference of the period of changing condition of the test waveform (hereinafter referred to as test period). The reference signal is applied to a timing generator 55 and a program power supply 60.

Timing generator 55 controls timing of change of the test waveform and so on. More specifically, before each test, IC tester control CPU 51 sets data of test condition, and applies necessary data for every test period to timing generator 55 through an internal address bus 54. Timing generator 55 programmably generates the test period set by IC tester control CPU 51.

A test pattern storing circuit 56 determines a pattern of test waveform for each test period. More specifically, IC tester control CPU 51 stores a test pattern at a prescribed address of test pattern storing circuit 56 before test, and during testing, applies an address signal to test pattern storing circuit 56. In response to the applied address signal, test pattern storing circuit 56 outputs the test pattern.

Test pattern generator 57 for function test is formed of a high speed microcomputer, and generates address and data and controls clocks, in accordance with a microprogram. A format circuit 58 synthesizes a timing signal applied from timing generator 55, a test pattern applied from test pattern storing circuit 56 and logic data applied from test pattern generator 57 for function test, for each test period, and generates a test waveform. Timing generator 55, test pattern storing circuit 56 and format circuit 58 constitute a waveform generating circuit 59.

Program power supply 60 includes a bias power supply for supplying a power supply voltage to IC 70 to be tested, and a data level power supply for determining levels of a driver and a comparator of pin electronics 61. Pin electronics 61 includes a driver, a comparator and a group of relays connecting these to IC 70 to be tested, and is coupled to IC 70 to be tested through a contact terminal 71. The driver generates a test signal to be applied to IC 70 to be tested based on the test waveform applied from waveform forming circuit 59 and a voltage value applied from program power supply 60. The comparator determines whether an output waveform of IC 70 under test is normal or not, based on the timing signal applied from timing generator 55 and the voltage value applied from program power supply 60. The result of determination is applied to a defective address storing circuit 62 through test pattern generator 57 for function test.

Defective address storing circuit 62 stores information of defective address of tested IC 70 applied from test pattern generator 57 for function test. A defect analyzing circuit 63 performs redundancy analysis of tested IC 70, for example, based on the information of defective address applied from defective address storing circuit 62.

In this manner, conventional IC tester 50 directly tested electrical characteristics of IC 70 through various pins of IC 70 to be tested. IC tester 50 must have channels, that is, waveform forming circuits 59, pin electronics drivers and so on, the number of which corresponds to the number of pins of IC 70 to be tested, and therefore, as an IC comes to have larger number of pins, the number of test channels is also increased, resulting in high cost of the tester. Further, the number of ICs which can be tested at one time by one tester is reduced, lowering efficiency of testing.

SUMMARY OF THE INVENTION

Therefore, an object of the present invention is to provide a semiconductor testing apparatus which attains improved test efficiency and lowers cost of testing.

Briefly stated, according to the present invention, a built in self test circuit is provided in a semiconductor device having a memory circuit, and in the semiconductor test apparatus, a power supply for applying a power supply voltage to the semiconductor device, an instructing circuit for instructing execution of a test and output of data indicative of the test result to the self test circuit, and a receiving circuit for receiving data output from the self test circuit are provided. Therefore, as compared with the prior art in which an address signal and a control signal are applied to the semiconductor device, the number of terminals for signal output and the number of pattern generators can be reduced, the number of semiconductor devices which can be tested at one time per one semiconductor testing apparatus is increased, and therefore the cost of testing is reduced and efficiency of testing is improved.

Preferably, the semiconductor device further includes a logic circuit, and the built in self test circuit tests at least a part of the logic circuit. Here, the cost of testing a semiconductor device including a memory circuit and a logic circuit can be reduced and test efficiency can be improved.

More preferably, a test circuit for testing that portion of the logic circuit which is not tested by the built in self test circuit is further provided. Here, burden on the built in self test circuit can be reduced, and the structure of the built in self test circuit is simplified.

Preferably, a clock generating circuit for applying a clock signal for synchronization between the semiconductor test apparatus and the built in self test circuit is further provided. Accordingly, synchronization between the semiconductor device and the semiconductor testing apparatus can readily and surely be attained.

Preferably, the built in self test circuit outputs data n bits by n bits, and the receiving circuit includes a serial/parallel converting circuit for generating, from the data output n bits by n bits from the built in self test circuit, parallel data of predetermined n×m bits, and storing apparatus for storing the parallel data generated by the serial/parallel converting circuit. When the value n is small, only a small number of data output pins is necessary, and if the value n is large, the time for data output is reduced.

Preferably, the semiconductor testing apparatus tests a plurality of semiconductor devices at one time, the serial/parallel converting circuit of the receiving circuit is provided corresponding to each of the semiconductor devices, and the receiving circuit further includes a buffer circuit for temporarily storing the plurality of parallel data generated by the plurality of serial/parallel converting circuits and successively applying each of the plurality of parallel data to the storing apparatus. Accordingly, while the buffer circuit is outputting data, the next data can be applied to the serial/parallel converting circuit, and therefore the time for testing can be reduced.

Preferably, the semiconductor testing apparatus tests a plurality of semiconductor devices simultaneously, the serial/parallel converting circuit of the receiving circuit is provided corresponding to each semiconductor device, and the receiving circuit further includes a switching circuit for successively applying each of the plurality of parallel data generated by the plurality of serial/parallel converting circuits to the storing circuit. Here, the plurality of semiconductor devices can be tested by a simple structure. Further, the serial/parallel converting circuit is provided for each semiconductor device, asynchronous different data of respective ones of the semiconductor devices can be accommodated even when the data are input simultaneously.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
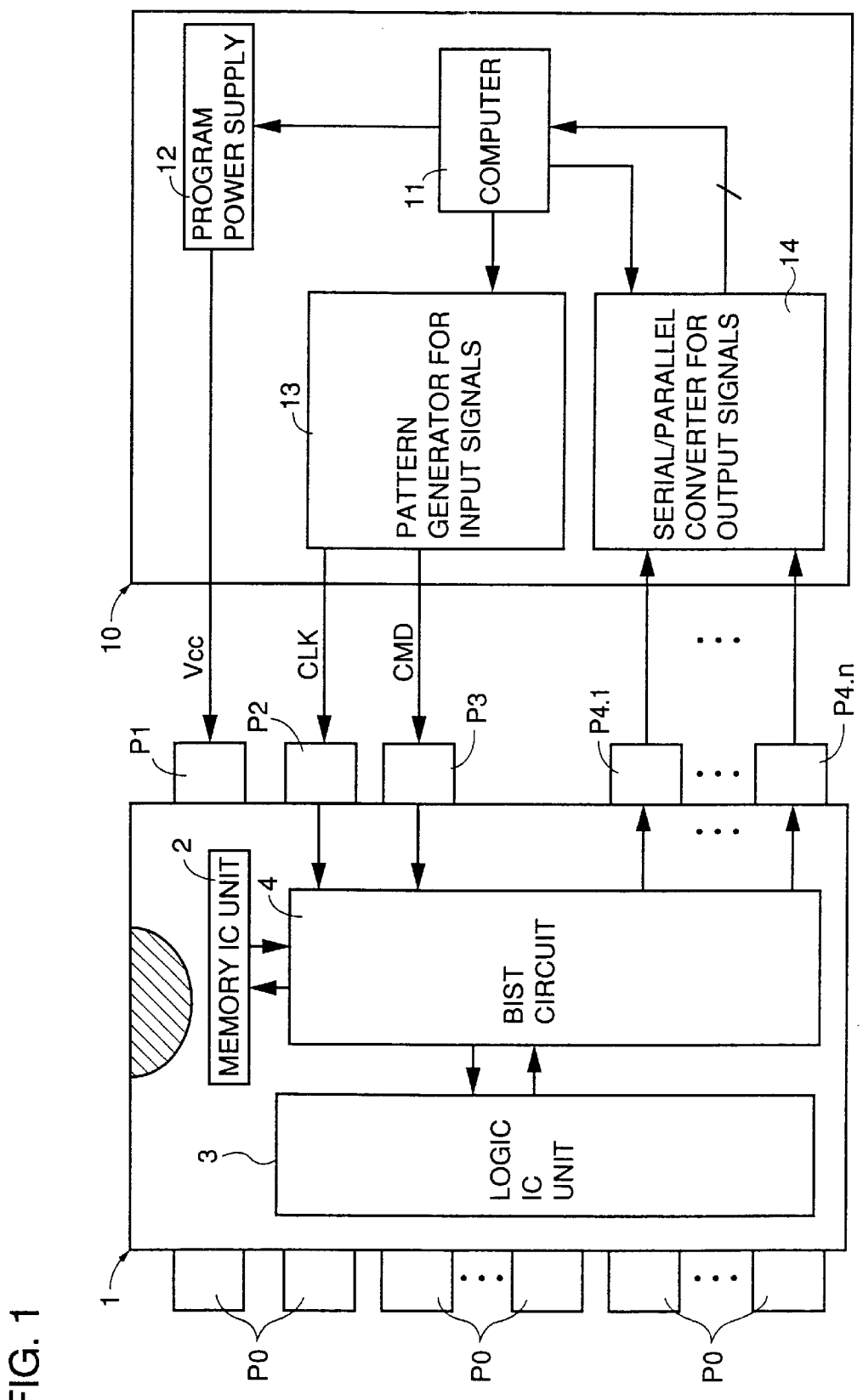
FIG. 1 is a block diagram showing a principle of the method of testing an IC in accordance with a first embodiment of the present invention.
Figure 2:
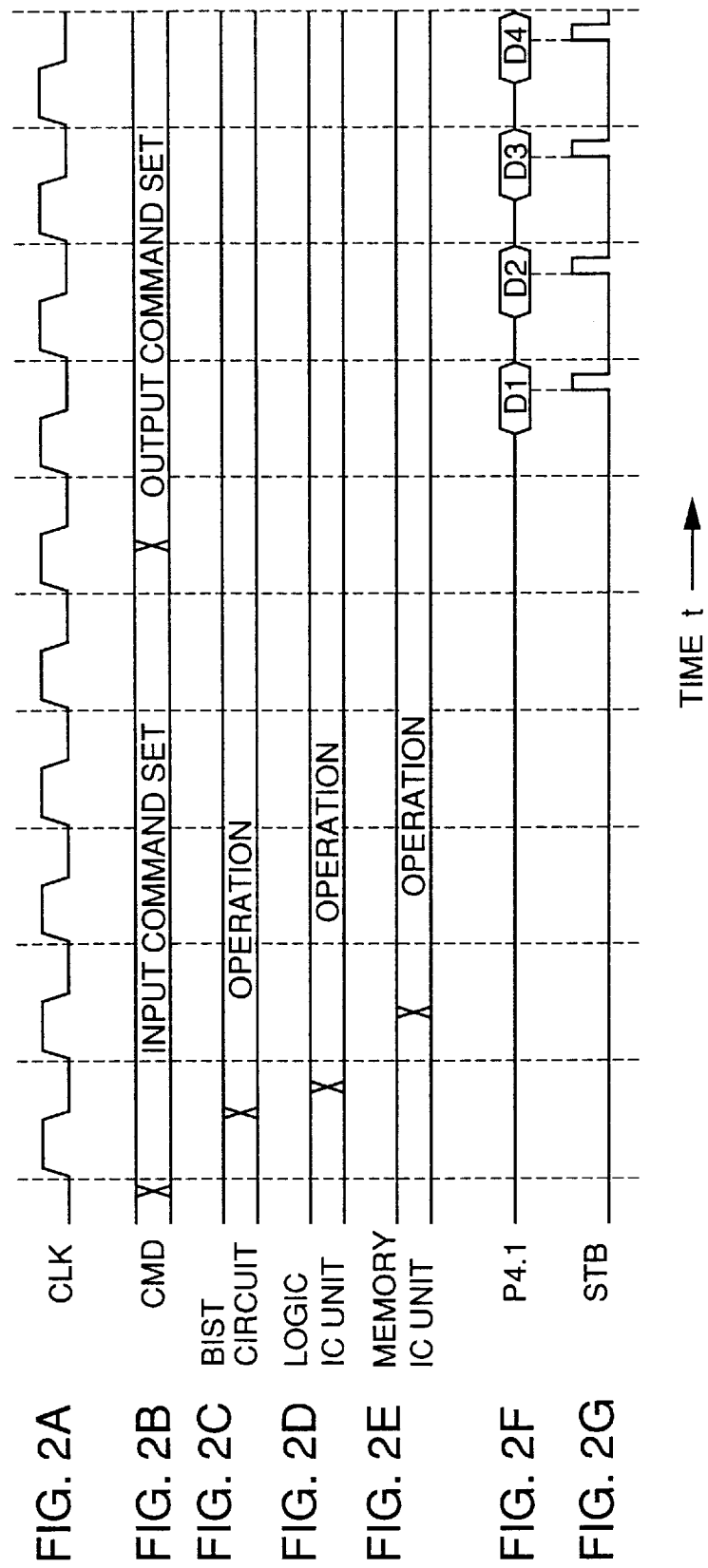
FIGS. 2A to 2G are timing charts showing the operations of the IC to be tested and IC tester shown in FIG. 1.

FIG. 1 is a block diagram showing the principle of the method of testing an IC in accordance with the first embodiment of the present invention. Referring to FIG. 1, an IC1 to be tested includes a memory IC unit 2, a logic IC unit 3, a BIST circuit (Built In Self Test circuit) 4 and pins P0 to P3, P4.1 to P4.n (where n is an integer not smaller than 1), while an IC tester 10 includes a computer 11, a program power supply 12, a pattern generator for input signals and a serial/parallel converter 14 for output signals.

Computer 11 controls program power supply 12, pattern generator 13 for input signals and serial/parallel converter 14 for output signals, and stores test and analysis results applied from serial/parallel converter 14 for output signals. Program power supply 12 applies a power supply voltage Vcc to a power supply pin P1 of IC1 to be tested. Pattern generator 13 for input signals applies a clock signal CLK for attaining synchronization between IC1 to be tested and tester 10, and a command signal CMD for instructing execution of test and output of data indicative of test result to BIST circuit 4 of IC1 to be tested, through pins P2 and P3, respectively.

Memory IC unit 2 includes a plurality of memory cells 2 arranged in a matrix of rows and columns, a decoder for selecting any of the plurality of memory cells in accordance with an address signal of 16 bits, for example, and a data input/output circuit for inputting/outputting data to and from the memory cell selected by the decoder and the outside. When an address signal and data are applied and the data is written to the memory cell, thereafter the same address signal is applied to read data from the memory cell, and the read data does not match the written data, the memory cell is determined to be defective. The defective memory cell is replaced by a spare memory cell. When a data is applied to logic IC unit 3 and the output data is not the expected data, logic IC unit 3 is determined to be defective.

BIST circuit 4 generates a test pattern and the like in accordance with the signals CLK and CMD, applies the test pattern and the like to memory IC unit 2 and logic IC unit 3, and tests and analyzes the units 2 and 3. Further, BIST circuit 4 applies data indicative of the test result (for example, address of the defective memory cell) serially 1 bit by 1 bit, on the basis of 16 bit unit, to serial/parallel converter 14 for output signals of IC tester 10, through pins P4.1 to P4.n (where n=1, for example). Pin P0 is for inputting an address signal, a control signal or the like.

Serial/parallel converter 14 for output signals of IC tester 10 converts 16 bits of serial data applied from BIST circuit 4 to parallel data of 16 bits, and applies to computer 11. Computer 11 stores the data applied from serial/parallel converter 14 for output signals.

FIGS. 2A to 2G are time charts showing the operation of IC1 to be tested and IC tester 10, shown in FIG. 1.

Referring to FIGS. 2A to 2G, clock signal CLK and command signal CMD are applied from pattern generator 13 for input signals of IC tester 10 to BIST circuit 4 of IC1 to be tested, and thereby execution of test and analysis is instructed to BIST circuit 4. In response, BIST circuit 4, logic IC unit 3 and memory IC unit 2 of IC1 operate, and thus test and analysis are executed. Thereafter, by the clock signal CLK and the command signal CMD, output of data indicative of the result of testing and analysis is instructed to BIST circuit 4. In response, BIST circuit 4 serially outputs data D1, D2, . . . D16 indicative of the results of testing and analysis, to serial/parallel converter 14 for output signals of IC tester 10 through pin 4.1, in synchronization with clock signal CLK.

Serial/parallel converter 14 for output signals takes each of serial data D1, D2, . . ., D16 in accordance with a strobe signal STB applied from pattern generator 13 for input signals, for example, converts the data to parallel data D1 to D16, and applies the converted data to computer 11. Computer 11 stores the data applied from serial/parallel converter 14 for output signals. The data is displayed on a monitor or printed out by a printer, as needed.

When BIST circuit 4 outputs data indicative of the test result several bits by several bits (for example, 4 bits by 4 bits), data output period can be reduced to 4 cycles, while the necessary number of pins P4 is increased to 4 (n=4).

Figure 3:
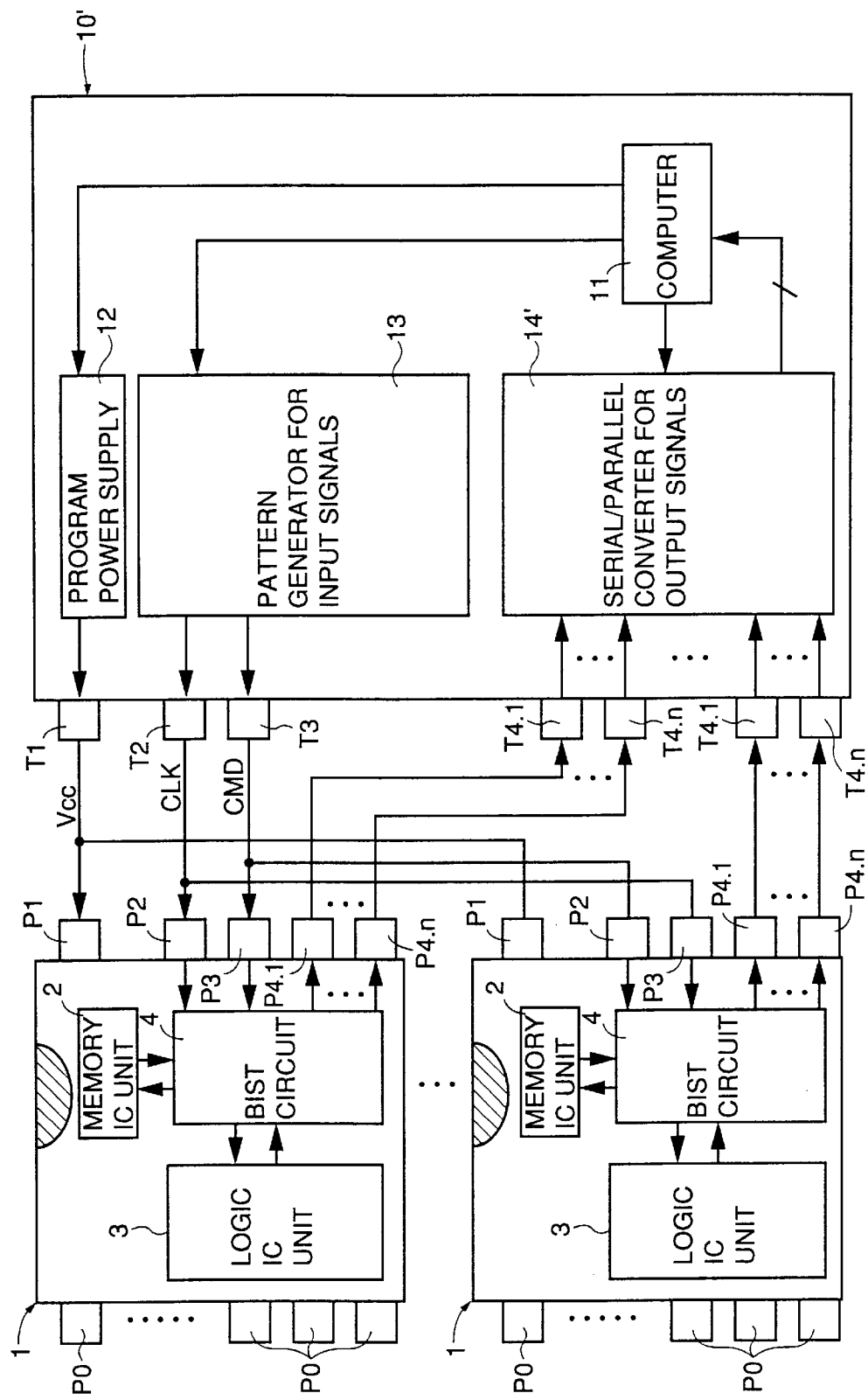
FIG. 3 is a block diagram showing, more specifically, the method of testing the IC described with reference to FIG. 1.

FIG. 3 is a block diagram showing, more specifically, the test method shown in FIG. 1. Referring to FIG. 3, actually, a plurality of ICs 1 are tested at one time. An IC tester 10' includes an output terminal T1 for outputting power supply voltage Vcc, an output terminal T2 for outputting clock signal CLK and an output terminal T3 for outputting command signal CMD. These terminals T1 to T3 are provided commonly to the plurality of ICs 1 to be tested.

Further, IC tester 10' includes input terminals T4.1 to T4.n for receiving serial data output from ICs 1 which are being tested. Terminals T4.1 to T4.n are provided in the same number of sets as the number of IC1 which can be tested at one time.

Serial/parallel converter 14' for output signals of IC tester 10' receives in parallel a plurality of serial data applied from the plurality of ICs 1 under test, converts the serial data applied from each of the ICs 1 under test to parallel data, and successively applies each of the parallel data of the plurality of ICs 1 under test to computer 11.

Figure 4:
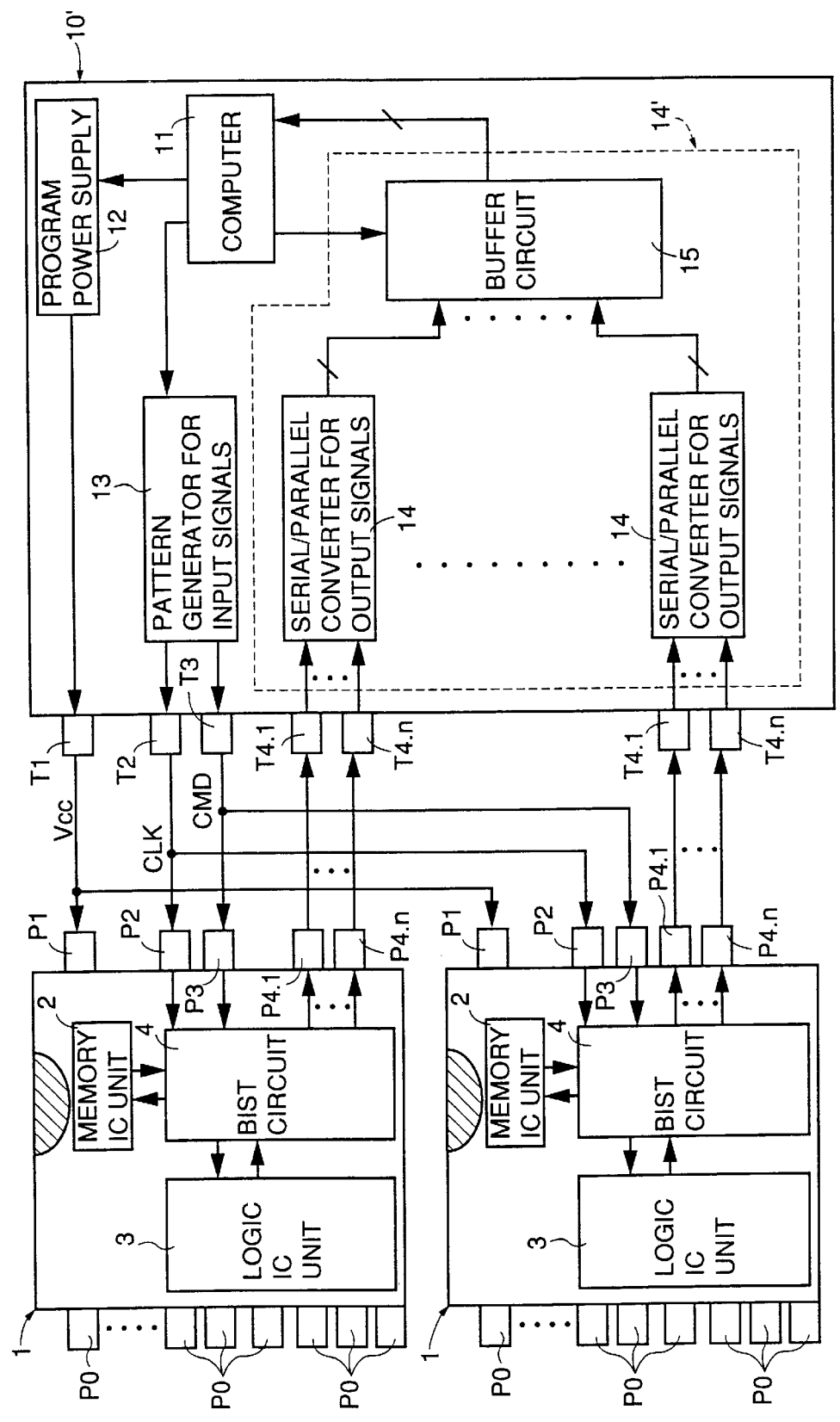
FIG. 4 is a block diagram showing a structure of a serial/parallel converter for output signals shown in FIG. 3.

FIG. 4 is a block diagram showing in greater detail IC tester 10' of FIG. 3. Referring to FIG. 4, serial/parallel converter 14' for output signals of IC tester 10' includes a plurality of serial/parallel converters 14 for output signals and a buffer circuit 15. The plurality of serial/parallel converters 14 for output signals are provided corresponding to a plurality of sets of input terminals T4.1 to T4.n, respectively. Each of the serial/parallel converters 14 for output signals converts the serial data input to the corresponding input terminals T4.1 to T4.n to parallel data and applies the parallel data to buffer circuit 15.

Buffer circuit 15 is controlled by computer 11, temporarily stores the parallel data applied from the plurality of serial/parallel converters 14 for output signals, and successively outputs each of the plurality of parallel data to computer 11. While buffer circuit 15 is outputting the parallel data to computer 11, the next serial data are input to serial/parallel converters 14 for output signals. Thus the time for testing is reduced.

Figure 5:
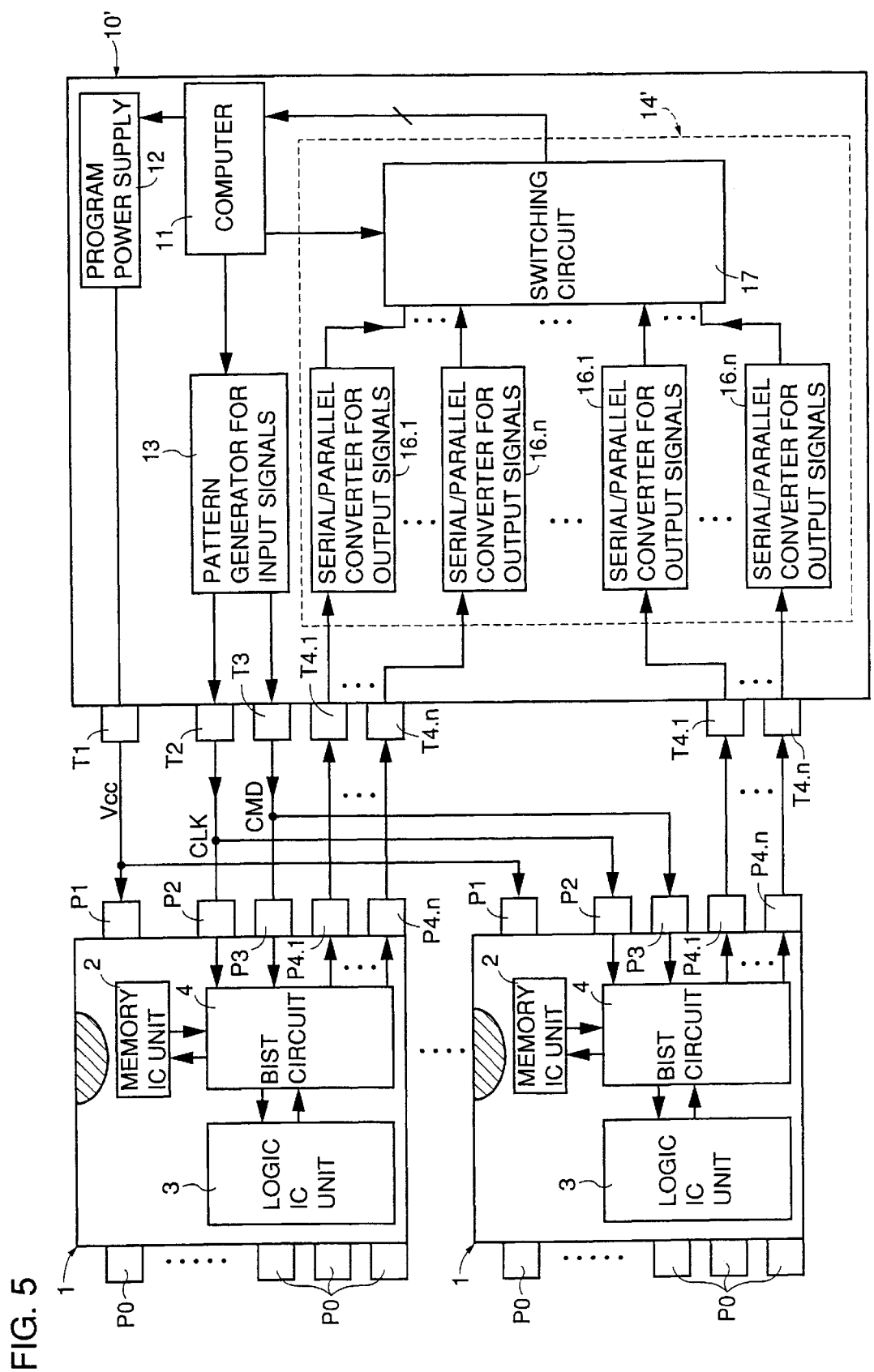
FIG. 5 is another block diagram showing a structure of the serial/parallel converter for output signals shown in FIG. 3.

FIG. 5 is another block diagram showing in greater detail IC tester 10' of FIG. 3. Referring to FIG. 5, serial/parallel converter 14' for output signals of IC tester 10' includes a plurality of sets of serial/parallel converters 16.1 to 16.n for output signals, and a switching circuit 17. The sets of serial/parallel converters 16.1 to 16.n for output signals are provided corresponding to a plurality of sets of input terminals T4.1 to T4.n, respectively. Serial/parallel converters 16.1 to 16.n for output signals of each set are provided corresponding to input terminals T4.1 to T4.n of the corresponding set. Serial/parallel converter 16.n for output signals converts serial data input through the corresponding input terminal 4.n to parallel data and latches the parallel data. One set of serial/parallel converters 16.1 to 16.n for output signals generate parallel data of the corresponding IC1 under test.

Switching circuit 17 is controlled by computer 11, and successively supplies each of the plurality of parallel data applied from serial/parallel converters 16.1 to 16.n for output signals of the plural sets to computer 11.

In the present embodiment, the pattern generator and the terminals for outputting address signals and control signals are unnecessary, and therefore the number of terminals and the pattern generator per one IC to be tested can be reduced. Therefore, the number of ICs which can be tested at one time per one tester can be increased, whereby cost of the test is reduced while efficiency of the test is improved.

Second Embodiment

Figure 6:
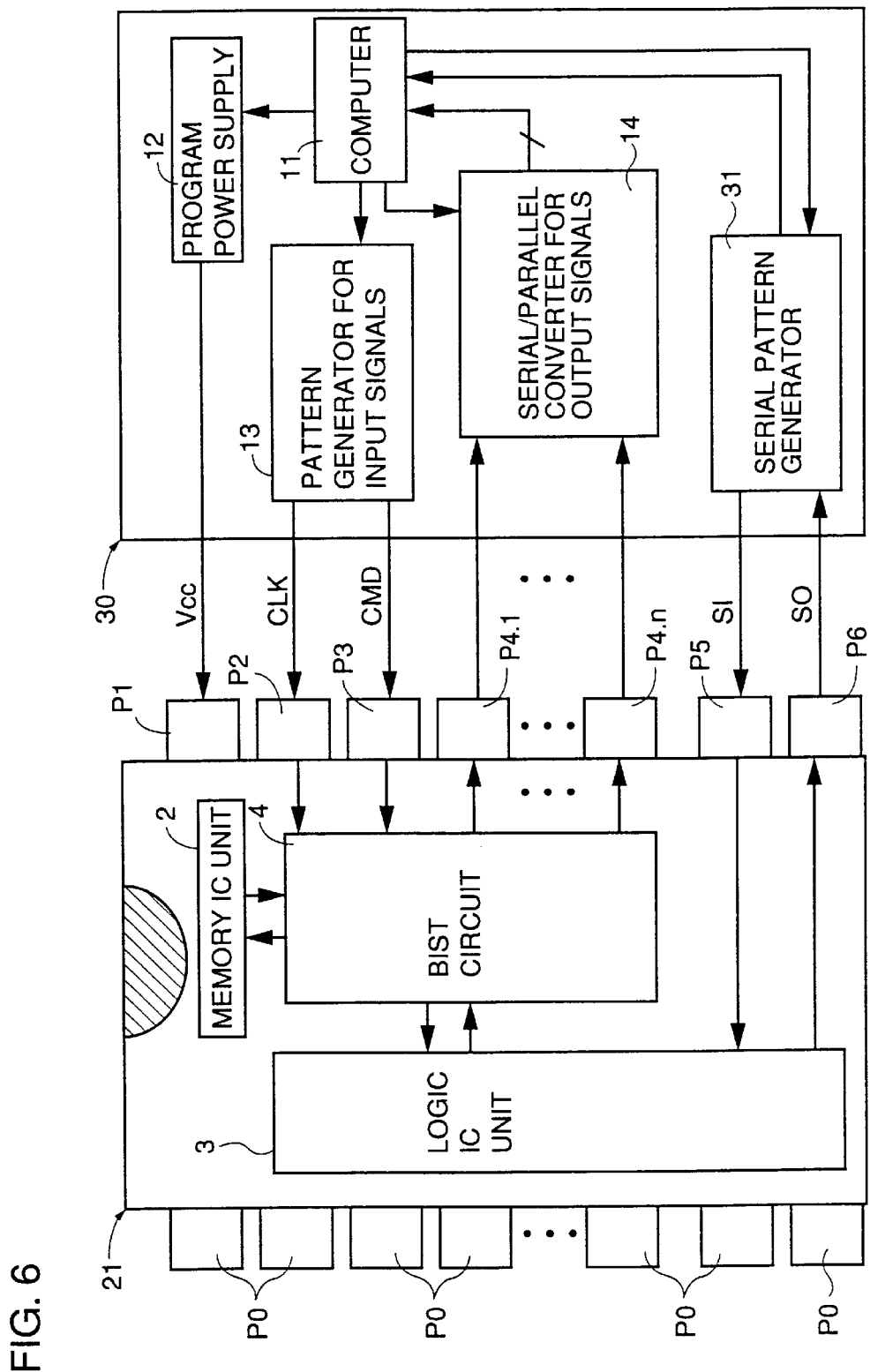
FIG. 6 is a block diagram showing principle of the method of testing ICs in accordance with a second embodiment of the present invention.

FIG. 6 is a block diagram showing the principal of testing ICs in accordance with the second embodiment of the present invention, which is comparable to FIG. 1.

Referring to FIG. 6, the method of testing differs from the method shown in FIG. 1 in that at least part of logic IC unit 3 of IC21 to be tested is tested by a so called scan path method. IC21 to be tested is newly provided with pins P5 and P6 for a scan in signal SI and a scan out signal SO, respectively. A serial pattern generator 31 is newly provided in IC tester 30.

Serial pattern generator 31 is controlled by computer 11, applies scan in signal SI to logic IC unit 3 through pin P5, receives scan out signal SO output from logic IC unit 3, determines whether logic IC unit 3 is defective or not based on the signals SI and SO, and applies the result of determination to computer 11. Other structure and operation are the same as those in the method of testing shown in FIG. 1, and therefore description thereof is not repeated.

Figure 7:
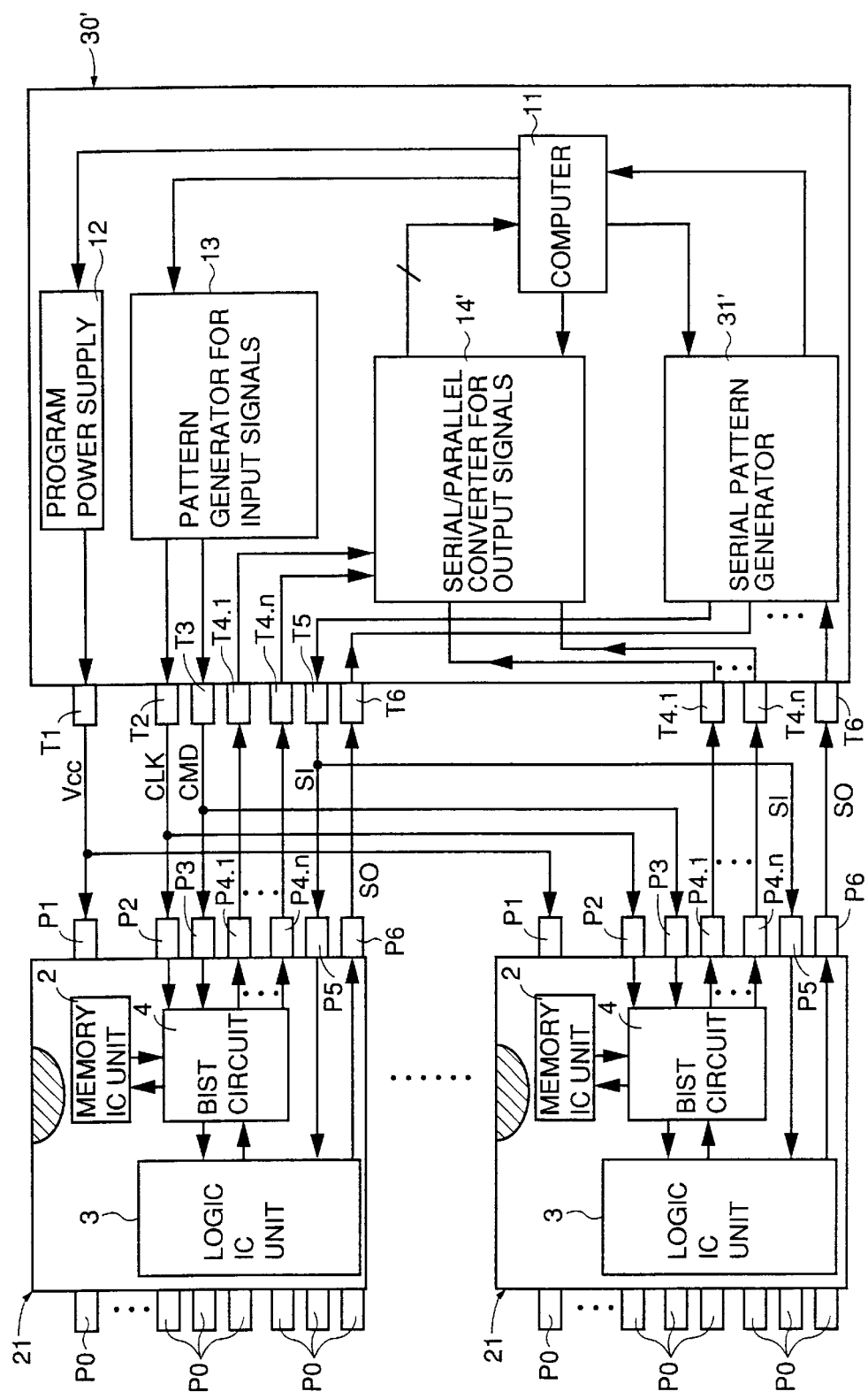
FIG. 7 is a block diagram showing, more specifically, the method of testing ICs described with reference to FIG. 6.
Figure 8:
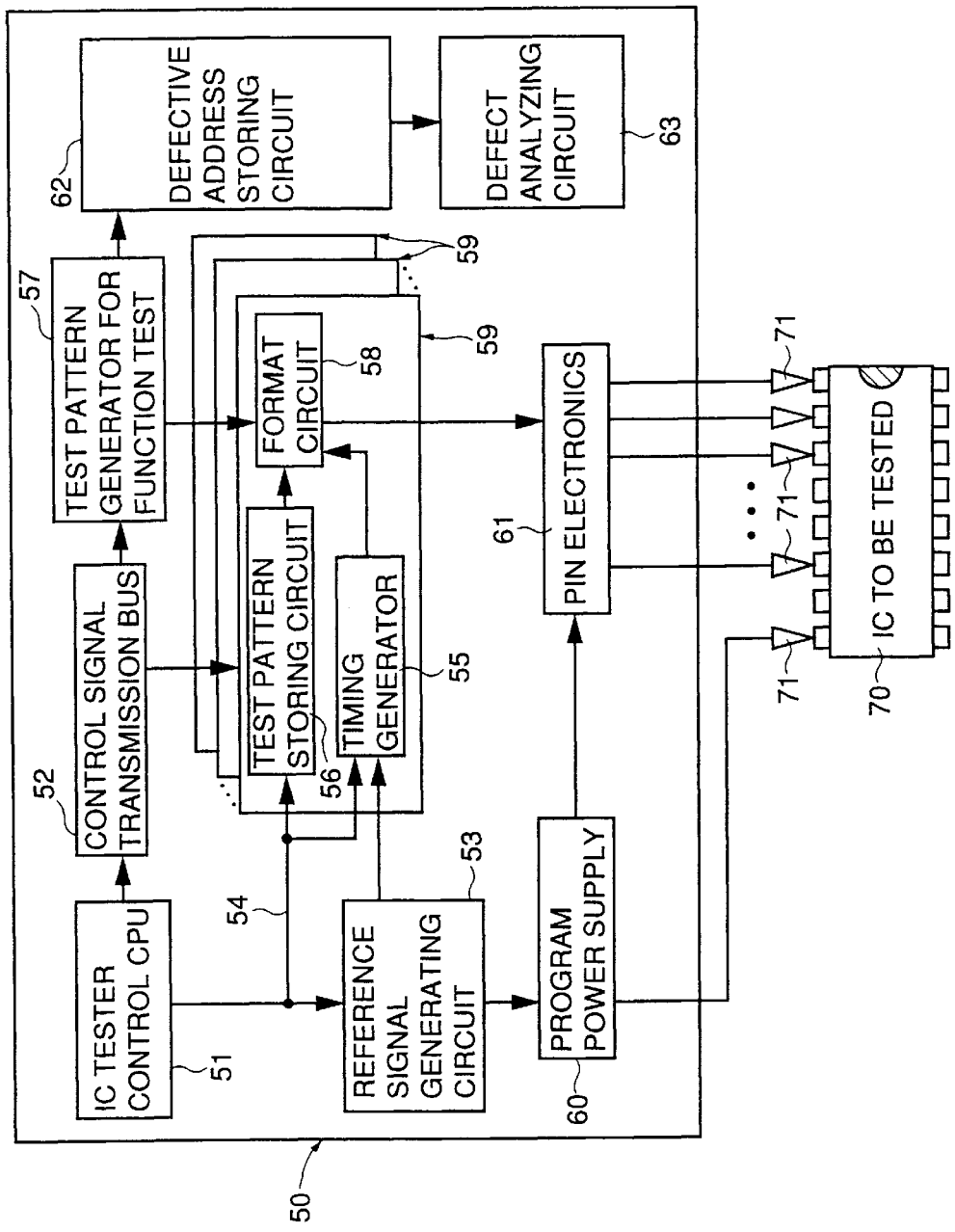
FIG. 8 is a block diagram showing the conventional method of testing ICs.

FIG. 7 shows in greater detail the method of testing shown in FIG. 6, and it corresponds to FIG. 3. Tester 30' has an output terminal T5 for outputting scan in signal SI, and an input terminal T6 for receiving scan out signal. Terminal T5 is provided common to a plurality of ICs 21 to be tested, while terminal T6 is provided in the same number as the number of ICs 21 which can be tested at one time.

Serial pattern generator 31' applies scan in signal SI to the plurality of ICs 21 through terminal T5, and receives scan out signal SO from the plurality of ICs 21 under test through the plurality of terminals T6, determines whether the plurality of ICs 21 under test are defective or not, and applies data indicative of the result of determination to computer 11.

In the present embodiment, at least part of logic IC unit 3 of ICs 21 to be tested is tested by tester 30' in accordance with the scan path method, and therefore burden on BIST circuit 4 of ICs 21 to be tested can be reduced, and therefore the structure of BIST circuit 4 can be simplified.

In the present embodiment, at least part of logic IC unit 3 is tested in accordance with the scan path method. It goes without saying that the logic IC unit 3 as a whole can be tested in accordance with the scan path method. In that case, the structure of BIST circuit 4 can further be simplified.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor testing apparatus for testing a semiconductor device including a memory circuit and a built in self test circuit for testing said memory circuit, comprising:

a power supply for applying a power supply voltage to said semiconductor device;

an instructing circuit for instructing execution of test and output of data indicative of test result to said built in self test circuit; and receiving circuit receiving data output from said built in self test circuit.

2. The semiconductor testing apparatus according to claim 1, wherein said semiconductor device further includes a logic circuit, and said built in self test circuit tests at least part of said logic circuit.

3. The semiconductor testing apparatus according to claim 2, further comprising a test circuit for testing that portion of said logic circuit which is not tested by said built in self test circuit.

4. The semiconductor testing apparatus according to claim 1, further comprising
a clock generating circuit for applying a clock signal for attaining synchronization between said semiconductor testing apparatus and said semiconductor device to said built in self test circuit.

5. The semiconductor testing apparatus according to claim 1, wherein said built in self test circuit outputs said data n bits by n bits (where n is an integer not smaller than 1);
said receiving circuit includes
a serial/parallel converting circuit for generating parallel data of predetermined n×m bits (where m is an integer not smaller than 2) from the data output n bits by n bits from said built in self test circuit, and
storing device storing the parallel data generated by said serial/parallel converting circuit.

6. The semiconductor testing apparatus according to claim 5, wherein
a plurality of semiconductor devices are tested simultaneously by said semiconductor testing apparatus,
said serial/parallel converting circuit of said receiving circuit is provided corresponding to respective semiconductor devices; and
said receiving circuit further includes a buffer circuit temporarily storing a plurality of parallel data generated by the plurality of said serial/parallel converting circuits and successively applies each of said plurality of parallel data to said storing device.

7. The semiconductor testing apparatus according to claim 5, wherein
a plurality of semiconductor devices are tested simultaneously by said semiconductor testing apparatus;
said serial/parallel converting circuit of said receiving circuit is provided corresponding to respective semiconductor devices; and
said receiving circuit further includes a switching circuit for successively applying each of the plurality of parallel data generated by the plurality of said serial/parallel converting circuits to said storing device.

* * * * *